(12) United States Patent
Shin et al.

(10) Patent No.: US 6,277,764 B1
(45) Date of Patent: Aug. 21, 2001

(54) INTERLAYERED DIELECTRIC LAYER OF SEMICONDUCTOR DEVICE AND METHOD OF MANUFACTURING THE SAME

(75) Inventors: Hong-jae Shin; Hee-sook Park, both of Seoul; Sung-jin Kim, Kyungki-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/224,560

(22) Filed: Dec. 30, 1998

(30) Foreign Application Priority Data

Dec. 30, 1997 (KR) .................................................. 97-77745

(51) Int. Cl.$^7$ .................................................. H01L 21/31
(52) U.S. Cl. ........................ 438/763; 438/624; 438/631; 438/699; 438/790
(58) Field of Search ..................... 438/633, 626, 438/645, 631, 692, 637, 625, 700, 421, 461, 901, 209, 763, 624, 699; 257/758, 784, 781, 750

(56) References Cited

U.S. PATENT DOCUMENTS

| | | | |
|---|---|---|---|
| 5,324,690 | * 6/1994 | Gelatos et al. .................. | 437/236 |
| 5,476,817 | * 12/1995 | Numata ............................. | 437/195 |
| 5,519,250 | * 5/1996 | Numata ............................. | 257/632 |
| 5,549,934 | 8/1996 | Garza et al. ..................... | 489/427 |
| 5,818,111 | 10/1998 | Jeng et al. ....................... | 776/257 |
| 5,858,869 | * 1/1999 | Chen ................................. | 438/597 |
| 5,939,771 | * 8/1999 | Usami ............................... | 257/643 |
| 5,960,317 | * 9/1999 | Jeong ............................... | 438/633 |
| 6,008,540 | * 12/1999 | Lu et al. .......................... | 257/758 |
| 6,030,706 | * 2/2000 | Eissa et al. ..................... | 438/421 |
| 6,037,668 | * 3/2000 | Cave et al. ...................... | 257/784 |
| 6,042,901 | * 3/2000 | Denison ........................... | 427/579 |
| 6,083,850 | * 7/2000 | Shields ............................. | 438/763 |

* cited by examiner

*Primary Examiner*—Mary Wilczewski
*Assistant Examiner*—David Goodwin
(74) *Attorney, Agent, or Firm*—Marger Johnson & McCollom, P.C.

(57) ABSTRACT

A method of forming an interlayer dielectric layer of a semiconductor device and an interlayer dielectric layer using the same. By the method, a semiconductor substrate formed metal interconnect lines thereon is provided, a first insulating layer of a low dielectric material is formed on the semiconductor substrate, by a spin coating, and a second insulating layer of a low dielectric material is formed on the first insulating layer, by the high density plasma chemical vapor deposition (CVD). The second insulating layer is planarized through a chemical mechanical polishing (CMP) process.

6 Claims, 1 Drawing Sheet

INTERLAYERED DIELECTRIC LAYER OF SEMICONDUCTOR DEVICE AND METHOD OF MANUFACTURING THE SAME

BACKGROUND OF THE INVENTION

1. Field of the Invention

The present invention relates to a semiconductor device, and more particularly, to a method of forming an interlayer dielectric layer on metal interconnect lines and an interlayer dielectric layer using the same.

2. Description of the Related Art

In general, as the integration of a semiconductor device in the semiconductor fabrication system increases, the operational speed increases. This is very important in forming metal interconnect lines for transmitting electrical signals. In fabrication processes highly integrated semiconductor device technologies for forming multi-layered interconnections are widely used in forming the metal interconnections thereby increasing the integration and improving the operational speed. Meanwhile, as the integration of the semiconductor device increases, the formed space between the metal interconnects becomes narrower. This in turn results in an unwanted increase in capacitance to be generated between the metal interconnects, and thus the operational speed of the semiconductor device must be lowered.

In many cases, it is very important to form an insulating layer between different metal interconnect lines. In the multi-layered interconnection of a highly integrated semiconductor device, an interlayer dielectric layer, typically an inter-metal dielectric film, must have good planarization to solve problems generated by the "bad step coverage," which is caused by multi-layered interconnection. Thus, the inter-metal dielectric film must have excellent characteristics for filling any narrow spaces between the metal interconnects. Also, the inter-metal dielectric film must be formed of a low dielectric material having a low dielectric constant to reduce the parasitic capacitance generated by adjacent metal interconnections.

A typical low dielectric material used for the interlayer dielectric layer is hydrogen silsesquioxane (HSQ), a spin on glass (SOG) doped with fluorine and a polymer formed by a spin coating, and SiOF, CF, BN and SiCO formed by a chemical vapor deposition (CVD).

Although low dielectric material such as the above low dielectric material layers formed by spin coating can fill the narrow space between the metal interconnect lines, they have difficulties undergoing chemical mechanical polishing (CMP) processing for planarization of the semiconductor surface. Thin film formed by the CVD method have limited ability to fill the narrow space between the metal interconnects.

SUMMARY OF THE INVENTION

To solve the above problems, it is a first object of the present invention to provide a method of forming an interlayer dielectric layer of a semiconductor device in which the interlayer insulating layer has a multi-layered structure including a first insulating layer formed by spin coating and a second insulating layer formed by high density plasma chemical vapor deposition (CVD) on the first dielectric layer. In this way one can (a) fill a space between metal interconnects and (b) easily perform planarization of the semiconductor surface.

It is a second object of the present invention to provide an interlayer dielectric layer formed by the above method.

According to a method of forming an interlayer dielectric layer of a semiconductor device of the present invention, a semiconductor substrate is formed having metal interconnect lines thereon, a first insulating layer of a low dielectric material is formed on the semiconductor substrate, and then a second insulating layer of a low dielectric material is formed on the first insulating layer.

Preferably, the first insulating layer is a hydrogen silsesquioxane (HSQ) layer formed by a spin coating, and the second insulating layer is a SiOF layer formed by the high density plasma chemical vapor deposition (CVD). The second insulating layer is preferably planarized using a CMP process after it is formed on the first insulating layer.

An interlayer dielectric layer of a semiconductor device formed by the method of the present invention includes: a semiconductor substrate wherein a metal interconnect is formed; a first insulating layer of a low dielectric material formed on the semiconductor substrate preferably by a spin coating; and a second insulating layer of a low dielectric material formed on the first insulating layer preferably by a high density plasma chemical vapor deposition (CVD).

According to the method of forming an interlayer dielectric layer of a semiconductor device of the present invention, the interlayer dielectric layer has a multi-layered structure, that is, a first insulating layer, which has the excellent characteristics of filling the space between the metal interconnects, and a second insulating layer formed on the first insulating layer on which a CMP process can be easily performed. Thus, according to the present invention, the space between the metal interconnect lines can be easily filled and the planarization can be simply performed. Also, the interlayer dielectric layer is formed of a low dielectric material layer, to thereby reduce the parasitic capacitance between the metal interconnect lines.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
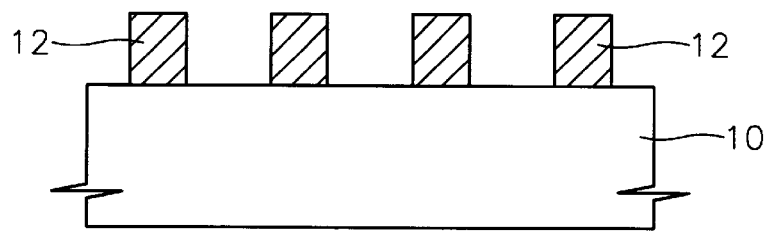
FIGS. 1 through 4 are sectional schematic views for illustrating a method of manufacturing an interlayer dielectric layer according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, which are "schematic," the thickness of layers and regions are exaggerated for illustrative purposes. It will also be understood that when a layer is referred to as being "on" another layer or substrate, it can be directly on the other layer or substrate, or other intervening layers may also be present.

In a method of forming a interlayer dielectric layer in a semiconductor device according to the present invention, at least one metal interconnect is formed on a semiconductor substrate, and then a first insulating layer is formed on the semiconductor substrate. Subsequently, a second insulating layer is formed on the first insulating layer.

Referring to FIG. 1, a metal interconnect layer of W, Al or Cu is typically formed on a semiconductor substrate 10. Subsequently, the metal interconnect layer typically is patterned to form at least one, and preferably a plurality of metal interconnect lines 12 on a predetermined region of the semiconductor substrate 10. At this time, active regions (not shown) divided by an isolation region (not shown) may be defined on the semiconductor substrate to manufacture the semiconductor device. Here, the isolation region may be formed by an isolation method using typical LOCOS (Local Oxidation of Silicon) or by forming a trench.

Figure 2:
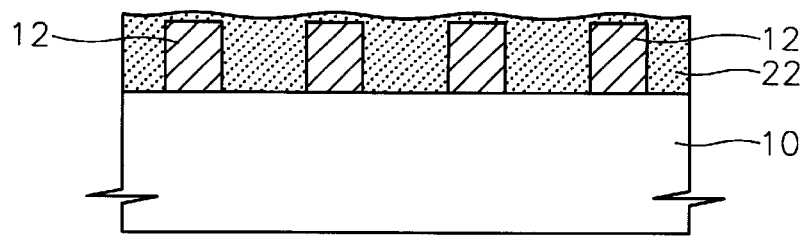

Referring to FIG. 2, a first insulating layer 22 having a relatively flat surface is formed, preferably by the spin coating, on the surface of the resultant structure where the metal interconnect lines 12 have been formed. The first insulating layer 22 is preferably formed by rotating the semiconductor substrate 10 on which the metal interconnect lines 12 is formed, using conventional spin coating technologies, and dropping the desired quantity of coating material, such as HSQ, using a spin coating dispenser (not shown). A low dielectric material, such as SOG, is capable of forming the first insulating layer 22 by spin coating same onto the semiconductor substrate 12. The spin coating operation may be performed as many times as required to fill the space between the metal interconnects 12 with the first insulating layer 22. The quantity of liquid dropped by the dispenser onto the semiconductor substrate 10 may be varied depending on the thickness of the metal line interconnect 12. The first insulating layer 22 fills the space between the metal interconnect lines 12 and the surface of the resultant structure is planarized. The first insulating layer 22 is annealed at a predetermined temperature to form an insulating layer in a solid state.

Figure 3:
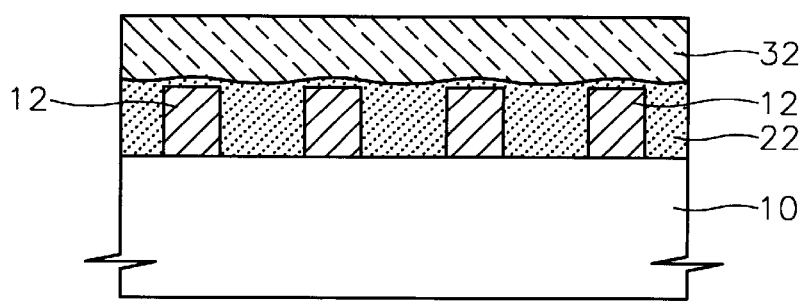

Referring to FIG. 3, a second insulating layer 32 is formed on the surface of the semiconductor substrate 10 in which the spaces between the metal interconnects 12 are filled with the first insulating layer 22, preferably by a high density plasma CVD. Preferably, a SiOF layer having a dielectric constant of between about 3.4 and 3.8 is used as the second insulating layer 32. Preferably, the gases used for forming the SiOF layer in a reaction chamber (not shown) are $SiH_4$, $SiF_4$, $O_2$ and Ar. The preferred flow rate of the gases $SiH_4$, $SiF_4$, $O_2$ and Ar flowing into the reaction chamber is 30~60 sccm, 20~40 sccm, 80~120 sccm and 30~60 sccm, respectively. At this time, a preferred pressure in the reaction chamber of from about I to 8 mTorr, an RF source power of between about 1880 and 2400 W, and a bias power of about 1500 to 2000 W is maintained. It is also preferable that the temperature of the semiconductor substrate 10 be set at about 300 to 400° C. In forming the SiOF layer by the above preferred high density plasma CVD method, the $SiH_4$, $SiF_4$, or $O_2$ is a reaction gas, and the $O_2$ and Ar are used as the etching gas. Using the high density plasma CVD method of the present invention, the SiOF layer is formed by an in-situ deposition/etching process, which has excellent thermal stability. The second insulating layer 32 may be a low dielectric material layer formed of CF, BN or SiCO, and having a dielectric constant of from about 2.2 to 2.5.

Figure 4:
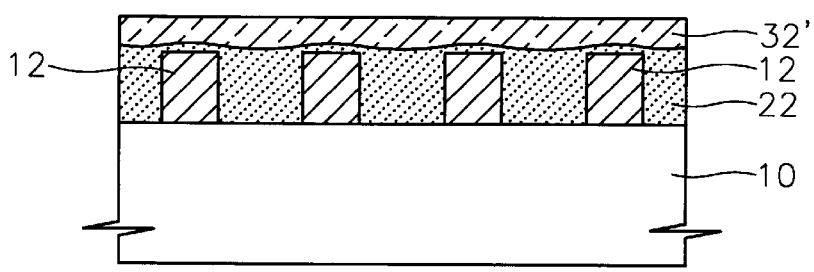

Referring to FIG. 4, the second insulating layer 32 is planarized using a CMP process on the entire surface of the resultant structure. The second insulating layer 32, after the CMP process, is between about 9000 and 15000 Å. A preferred interlayer dielectric layer comprises a low dielectric material such as HSQ formed by the spin coating, and a layer of a low dielectric material such as SiOF is formed thereon by the plasma high density CVD. The HSQ layer can react with a slurry solution. Thus making the CMP process with respect to the HSQ layer quite difficult. Reference numeral 32' describes an insulating layer after the CMP process planarizes the second insulating layer 32.

Referring again to FIG. 4, an exemplary semiconductor device of this invention includes the semiconductor substrate 10 on which the metal interconnects 12 is formed, the first insulating layer 22 filling the spaces between the metal interconnect lines 12, and the insulating layer 32' formed on the first insulating layer 22.

The first insulating layer 22 is typically a low dielectric material layer formed by the spin coating, preferably the HSQ layer. Also, the insulating layer 32' is a low dielectric material layer formed by the high density plasma CVD, preferably the SiOF layer formed by the plasma high density CVD method. Also, preferably, the insulating layer 32' is planarized by the typical CMP process to avoid difficulties in performing a photolithography process caused by the bad step coverage.

To evaluate the stability of a thin film, we subjected the thin film to thermal treatment for 100 hours at 350° C., and have the following results.

The SiOF film deposited by plasma enhanced chemical vapor deposition (PECVD) has a compressive stress of 0.7E9 dyne/cm$^2$. After thermal treatment, however, the SiOF film deposited by PECVD has a tensile stress of 1.1E9 dyne/cm$^2$. This indicates that the film quality is changed by a thermal treatment occurring after formation of the SiOF film deposited by PECVD. And, the change in stress generates large stress migration in the metal interconnect lines of a semiconductor device, which may cause hillocks in the metal interconnect lines.

The SiOF film deposited by high density plasma chemical vapor deposition (HDPCVD) has a compressive stress of 1.2E9 dyne/cm$^2$. After thermal treatment, the compressive stress is reduced to 0.8E9 dyne/cm$^2$.

Therefore, the stress of the SiOF film deposited by HDPCVD changes less due to thermal treatment than the stress of the SiOF film deposited by PECVD, and the HDPCVD film is more stable than the PECVD film. As a result, the quality of SiOF film deposited by HDPCVD is improved compared to the SiOF film deposited by PECVD. It is believed that the improvement is due to HDPCVD processing at a pressure of several mTorr and in the ambient including Argon gas, instead of the PECVD processing at several Torr.

The table provides film stress measurement before and after thermal treatment of the SiOF films. The thermal treatment is conducted at 350° C. for 100 hours. In the table, "+" means tensile stress, and "−" means compressive stress.

TABLE 1

| Film | Stress (E9 dyne/cm$^2$) | | |
| --- | --- | --- | --- |
| | Initial | After 100 hours | Change |
| SiOF by PECVD | −0.7 | +1.1 | 1.8 |
| SiOF by HDPCVD | −1.2 | −0.8 | 0.4 |

According to the preferred method of forming an interlayer dielectric layer of a semiconductor device of the present invention, the interlayer dielectric layer has a multi-layered structure, that is, the first insulating layer 22 formed by the spin coating which has the excellent characteristics of filling the space between the metal interconnects 12 and the second insulating layer 32 formed on the first insulating layer 22 by the high density plasma CVD on which it is easy to perform the CMP process. Also, the first insulating layer 22 and the second insulating layer 32 are formed of a low dielectric material. Thus, the parasitic capacitance between the metal interconnects 12 reduces.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method of forming a interlayer dielectric layer of a semiconductor device, comprising:

providing a semiconductor substrate;

forming a plurality of metal interconnect lines on said semiconductor substrate, said metal interconnect lines defining spaces therebetween;

forming a first insulating layer of hydrogen silsesquioxane onto the semiconductor substrate so that the spaces between the metal interconnect lines are filled with said low dielectric material; and forming a second insulating layer of SiOF on the first insulating layer, wherein the SiOF layer is formed using $SiH_4$, $SiF_4$, $O_2$ and Ar.

2. The method of claim 1, further comprising the step of planarizing the second insulating layer after forming said second insulating layer.

3. The method of claim 1, wherein the second insulating layer consists essentially of a CF, BN or SiCO layer.

4. The method of claim 1, wherein the flow rate of the gases $SiH_4$, $SiF_4$, $O_2$ and Ar flowing into the reaction chamber is 30~60 sccm, 20~40 sccm, 80~120 sccm and 30~60 sccm, respectively.

5. The method of claim 1, wherein the SiOF layer is formed in a reaction chamber with a pressure from about 1 to 8 mTorr, an RF source power of between about 1880 and 2400 W, and a bias power of about 1500 to 2000 W.

6. The method of claim 1, wherein the $SiH_4$, $SiF_4$, or $O_2$ is a reaction gas, and the $O_2$ and Ar are used as the etching gas.

* * * * *